United States Patent [19]

Sasamura

[11] Patent Number: 4,578,647
[45] Date of Patent: Mar. 25, 1986

[54] AMPLIFIER CIRCUIT
[75] Inventor: Kouhei Sasamura, Sagamihara, Japan
[73] Assignee: Victor Company of Japan, Limited, Kanagawa, Japan
[21] Appl. No.: 767,252
[22] Filed: Aug. 20, 1985

Related U.S. Application Data

[63] Continuation of Ser. No. 477,808, Mar. 22, 1983, abandoned.

[30] Foreign Application Priority Data

Mar. 25, 1982 [JP] Japan .............................. 57-42267[U]

[51] Int. Cl.⁴ .............................................. H03F 3/16
[52] U.S. Cl. .................................... 330/253; 330/311; 330/277
[58] Field of Search ............... 330/253, 255, 250, 277, 330/300, 301, 310, 311

[56] References Cited

U.S. PATENT DOCUMENTS 3,419,809 12/1968 Lach et al. ....................... 330/260 X
3,530,395 9/1970 Prusha ............................ 330/260 X
4,301,421 11/1981 Yokoyama ...................... 330/260 X Primary Examiner—Eugene R. LaRoche
Assistant Examiner—Steven J. Mottola
Attorney, Agent, or Firm—Jordan and Hamburg

[57] ABSTRACT

An amplifier includes a differential amplifier and an operational amplifier. An input signal is amplified by the differential amplifier and then fed to the operational amplifier which then delivers it after amplification. Part of the operational amplifier output is negatively fed back to one of inputs of the differential amplifier by a feedback element. Two differential amplifiers may be installed in the amplifier circuit, the first for amplifying the input signal and the second for amplifying an output of the first. The output of the second differential amplifier is fed to the operational amplifier, while part of an output of of the operational amplifier is negatively fed back to one of inputs of the second differential amplifier by a feedback element. The negative feedback cuts down the noise voltage of the whole amplifier circuit in terms of an input and increases the GB product.

8 Claims, 8 Drawing Figures

AMPLIFIER CIRCUIT

This application is a continuation, of application Ser. No. 477,808, filed Mar. 22, 1983, abandoned.

BACKGROUND OF THE INVENTION

The present invention generally relates to amplifier circuits and, more particularly, to an amplifier circuit of the type which uses a differential amplifier or an operational amplifier and is suitable for integration.

An operational amplifier generally involves a substantial level of noise due to the inherent procedure for the production and which may even amount to 3 nV/$\sqrt{Hz}$ to 20 nV/$\sqrt{Hz}$. This results in a poor signal-to-noise or S/N ratio when the signal level is low. Meanwhile, the gain-to-bandwidth or GB product of an operational amplifier is generally small. A large GB product is unattainable unless the circuit construction is made disproportionately intricate and, therefore, expensive.

To settle these problems, there has been proposed a circuit which uses a differential amplifier at its initial input stage and couples an output of the differential amplifier to an operational amplifier. This prior art circuit achieves a noise voltage in terms of an input which is 3-4 nV/$\sqrt{Hz}$, for example, which is a substantial improvement over an amplifier circuit which comprises an operational amplifier only. Another improvement is that the GB product is about 10 times the GB product of the amplifier circuit having only an operational amplifier.

SUMMARY OF THE INVENTION

It is an object of the present invention to provide an amplifier circuit which realizes an additional decrease in noise voltage and, therefore, a desirable S/N ratio.

It is another object of the present invention to provide an amplifier circuit which implements a further increase in GB product to insure an excellent amplification characteristic.

It is another object of the present invention to decrease the noise voltage and increase the GB product by means of a simple circuit arrangement which is desirable for integration.

It is another object of the present invention to suppress distortion of a signal.

It is another object of the present invention to provide an amplifier circuit which achieves the above objects at a low cost.

It is another object of the present invention to provide a generally improved amplifier circuit.

In one aspect of the present invention, there is provided an amplifier circuit having a differential amplifier supplied with a signal and an operational amplifier supplied with an output of the differential amplifier. The amplifier circuit has a feedback element therein for negatively feeding back part of an output of the operational amplifier to one of inputs of the differential amplifier.

In another aspect of the present invention, there is provided an amplifier circuit having a first differential amplifier supplied with a signal, a second differential amplifier supplied with an output of the first differential amplifier and an operational amplifier supplied with an output of the second differential amplifier. The amplifier circuit includes a feedback element for negatively feeding back part of an output of the operational amplifier to one of inputs of the second operational amplifier.

The above and other objects, features and advantages of the present invention will become apparent from the following detailed description taken with the accompanying drawings.

DESCRIPTION OF THE PREFERRED EMBODIMENTS

While the amplifier circuit of the present invention is susceptible of numerous physical embodiments, depending upon the environment and requirements of use, substantial numbers of the herein shown and described embodiments have been made, tested and used, and all have performed in an eminently satisfactory manner.

To facilitate understanding of the present invention, a brief reference will be made to a prior art amplifier circuit, depicted in FIG. 1. The amplifier circuit of FIG. 1 is designed to achieve a larger GB product and a lower noise voltage in terms of an input.

Figure 1:
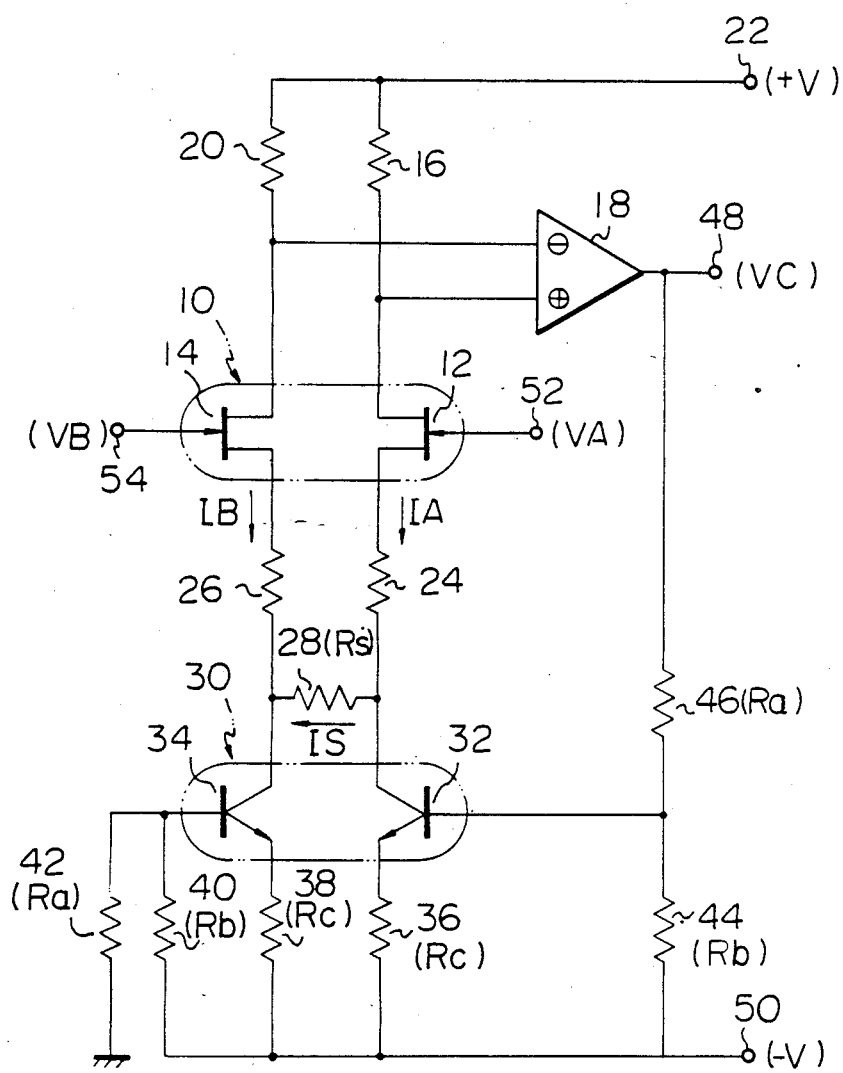
FIG. 1 is a circuit diagram of a prior art amplifier circuit.

In FIG. 1, a dual field effect transistor (FET) comprises FETs 12 and 14 which constitute a differential amplifier. The FETs 12 and 14 may either be of the P-channel type or of the N-channel type. Supposing the use of the N-channel type by way of example, the drain of the FET 12 is connected to a resistor 16 and the non-inverting input of an operational amplifier 18. The drain of the FET 14 is connected to a resistor 20 and the inverting input of the operational amplifier 18. The resistors 16 and 20, employed for bias purpose, are commonly connected to a terminal 22 to which a bias voltage +V is applied. The source of the FET 12 is connected to a resistor 24 which is in turn connected to a resistor 28. Likewise, the source of the FET 14 is connected to a resistor 26 which is connected to the resistor 28.

A dual transistor 30 serves as a second differential amplifier and comprises transistors 32 and 34. The transistor 32 is connected at the collector to the resistors 24 and 28 and at the emitter to a resistor 36. The transistor 34 is connected at the collector to the resistors 26 and 28 and at the emitter to a resistor 38. The base of the transistor 34 is connected to resistors 40 and 42 while the resistor 42 is connected to ground. The base of the transistor 32 is connected to resistors 44 and 46 and the resistor 46 is connected to an output terminal 48 of the operational amplifier 18. The resistors 36, 38, 40 and 44 are connected together to a terminal 50 to which a bias voltage −V is applied.

Input signals VA and VB are coupled to the amplifier circuit at input terminals 52 and 54 which are connected to the gates of the FETs 12 and 14 respectively. The output VC of the amplifier circuit appears at the output terminal 48 of the operational amplifier 18. The inptut signals VA and VB are respectively amplified by the FETS 12 and 14, further amplified by the operational amplifier 18 and then delivered to the output terminal 52 as the output signal VC. The signal VC is demultiplied by the resistors 46 and 44 to be fed to the base of the transistor 32.

Supposing that the source currents of the FETs 12 and 14 are IA and IB respectively, the current flowing through the resistor 28 is IS, the resistance of the resistors 42 and 46 is Ra, the resistance of the resistors 40 and 44 is Rb, the resistance of the resistors 36 and 38 is Rc, and the resistance of the resistor 28 is Rs, the following equations hold:

$$IA = \frac{Rb(V + VC)}{(Ra + Rb)Rc} \qquad \text{Eq. (1)}$$

$$IB = \frac{Rb \cdot V}{(Ra + Rb)Rc} \qquad \text{Eq. (2)}$$

$$IA - IB = 2IS \qquad \text{Eq. (3)}$$

$$IS = \frac{2(VB - VA)}{Rs} \qquad \text{Eq. (4)}$$

In the Eqs. (1)-(4), the closed loop gain of the circuitry is assumed to be sufficiently high. The Eqs. (1)-(4) teach that the source current of the FET 14 depends only on the resistance and bias voltage and reamins constant. The source current IA of the FET 12 is effected by the output signal VC of the operational amplifier 18 although basically remaining constant as the source current IB. The current IS flowing through the resistor 28 is a current which is proportional to a difference between the input signals VA and VB. It will thus be seen that the differential amplifier constituted by the dual transistor 30 operates as a constant current circuit for the differential amplifier constituted by the dual FET 10 and, also, part of a feedback circuit for the output signal VC.

From the Eqs. (1)-(4), the amplification degree Av is expressed as:

$$Av = K \cdot \frac{1}{Rs} \qquad \text{Eq. (5)}$$

where K is $$K = 2Rc(Ra+Rb)/Rb \qquad \text{Eq. (6)}$$

Where the amplification degree Av of the amplifier circuit is 60 dB for example, the GB product is substantially 10 times the GB product attainable with an amplifier circuit which comprises the operational amplifier 18 only.

It is known that when the operational amplifier 18 has a noise voltage of 15 nV/$\sqrt{Hz}$ and the dual FET 10 and dual transistor 30 have a common noise voltage of 1 nV/$\sqrt{Hz}$, the whole amplifier circuit develops a noise voltage which ranges from 3 nV/$\sqrt{Hz}$ to 4 nV/$\sqrt{Hz}$. As generally accepted, the noise voltage generated in an amplifier circuit is determined by the magnitude of noise generated in the first input stage element. Then, the noise voltage of the amplifier circuit shown in FIG. 1 is expected to be determined by the noise voltage (1 nV/$\sqrt{Hz}$) in the dual FET 10, which constitutes the first input stage of the amplifier circuit. In practice, however, the noise voltage of the amplifier circuit lies within the range of 3-4 nV/$\sqrt{Hz}$ as stated above. This noise voltage is several times the noise voltage of the dual FET 10 (1 nV/$\sqrt{Hz}$) and, therefore, unsatisfactory although improved over the amplifier circuit which solely comprises the operational amplifier 18.

Figure 2:
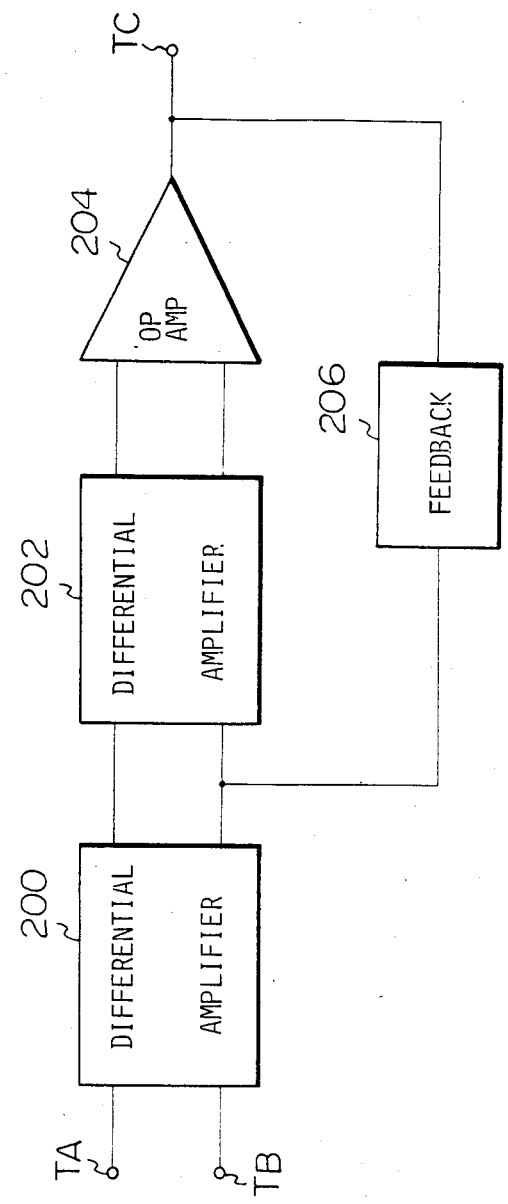
FIG. 2 is a block diagram representing a basic construction of an amplifier circuit of the present invention.

Referring to FIG. 2, an amplifier circuit embodying the present invention is shown and includes a differential amplifier 200 at the first input stage thereof. The differential amplifier 200 connects to a second differential amplifier 202 which in turn connects to an operational amplifier 204. A feedback element 206 is included in the circuitry so that the output of the operational amplifier 204 may be negatively fed back to the differential amplifier 202.

While the differential amplifier 200 at the first input stage is not essential, its presence is preferred because the lack of signal amplification by the amplifier 200 would lower the gain and allow the input impedance be effected by the feedback. Particularly, use of an FET or the like for the amplifier 200 will improve the input impedence of the whole amplifier circuit.

The feedback element 206 is adapted for the negative feedback of part of the output of the operational amplifier 204 to the second stage differential amplifier 202. The amount of feedback and the phase depend on the construction of the feedback element 206. Usually, the feedback element 206 is made up of a resistor, a capacitor, a coil and other passive elements, as well known in the art. In the embodiment described hereinafter, only a resistor is used to constitute the feedback element 206.

Figure 3:
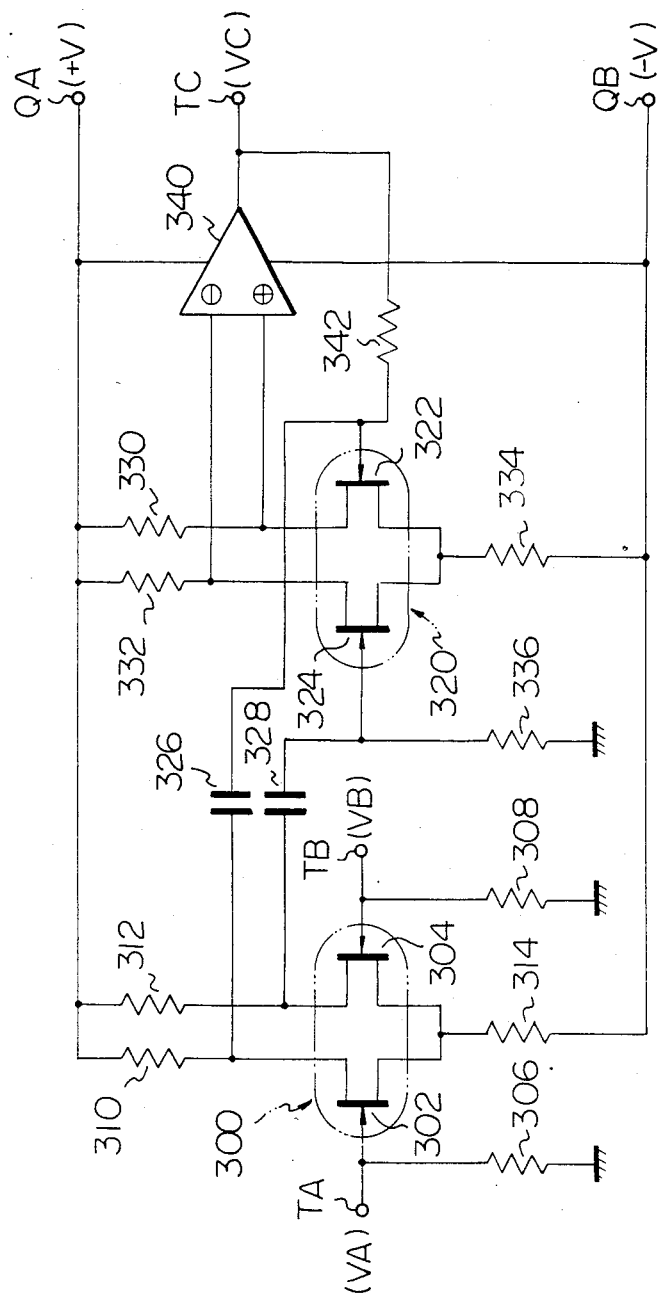
FIG. 3 is a circuit diagram of an amplifier circuit embodying the present invention.

Referring to FIG. 3, a practical construction of the amplifier circuit shown in FIG. 2 is illustrated. A dual FET 300 comprises a pair of FETs 302 and 304 which, like a monolithic IC, is formed on a common substrate and housed in a common package. Therefore, the FETs 302 and 304 are well matched in characteristic and may be regarded substantially identical in the constant of an equivalent circuit.

The gate of the FET 302 is connected to an input terminal TA and a resistor 306, while the gate of the FET 304 is connected to an input terminal TB and a resistor 308. The drains of the FETs 302 and 304 are respectively connected to resistors 310 and 312 and the sources commonly to a resistor 314.

The construction described so far constitutes the first stage differential amplifier 200 shown in FIG. 2.

A second dual FET 320, like the first 300, comprises a pair of FETs 322 and 324 which are identical in characteristic. The gates of the FETs 322 and 324 are respectively connected to capacitors 326 and 328 which are in turn respectively connected to the drains of the FETs 302 and 304 of the dual FET 300. The drains of the FETs 322 and 324 are respectively connected to resistors 330 and 332 while the sources are commonly connected to a resistor 334. This part of the construction forms the second stage differential amplifier 202 shown in FIG. 2. It will be noted that the capacitors 326 and 328 serve to couple the two differential amplifiers to each other and may be omitted if necessary.

The drain of the FET 322 is connected to the noninverting input of an operational amplifier 340 and the drain of the FET 324 to the inverting input of the operational amplifier 340. The output of the amplifier 340 is connected to an output terminal TC which is connected to a resistor 342. This resistor 342 is connected to the gate of the FET 322 and serves the function of the feedback element 206.

The resistors 310, 312, 330 and 332 and the operational amplifier 340 are connected together to a terminal QA to which a bias voltage +V is applied from the outside. Meanwhile, the resistors 314 and 334 and the operational amplifier 340 are connected to a terminal QB to which a bias voltage −V is applied from the outside. The resistors 306, 308 and 336 are individually connected to ground.

In operation, voltages VA and VB are fed to the input terminals TA and TB respectively. The input signals VA and VB are amplified by the dual FET 300, picked up at the drains of the FETs 302 and 304, and then delivered via the capacitors 326 and 328 to the gates of the FETs 322 and 324, which constitute the dual FET 320. The signals are amplified by the dual FET 320 and respectively fed from the drains of the FETs 322 and 324 to the operational amplifier 340. The amplifier 340 processes these input signals to deliver an output signal VC thereof to the output terminal TC. Part of this output signal VC is fed back to the FET FET 322 via the resistor 342.

Figure 4:
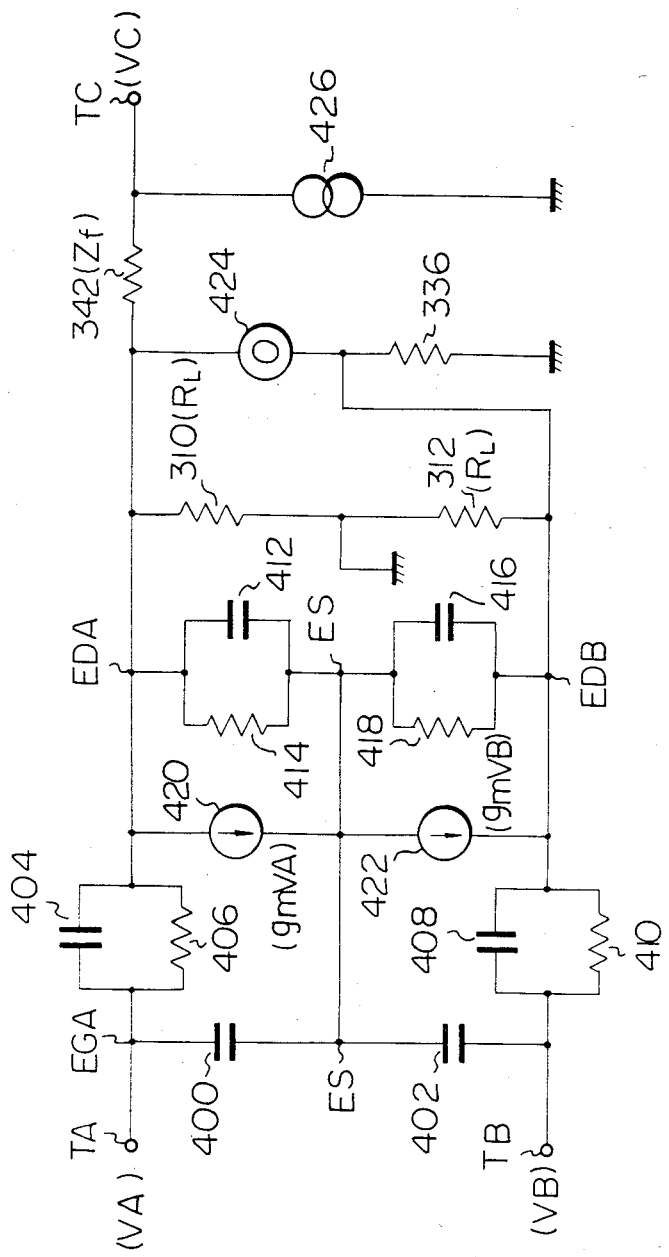
FIG. 4 is a circuit diagram showing an equivalent circuit of the amplifier circuit shown in FIG. 3.

Reference will be made to FIG. 4 for describing the feedback operation mentioned above. In FIG. 4, which shows an equivalent circuit of the dual FET 320 inclusive of the operational amplifier 340, the gates of the FETs 302 and 304 are respectively designated by the reference characters EGA and EGB and the drains by EDA and EDB. The sources of the FETs 302 and 304 are commonly designated by the characters ES due to their common connection.

A capacity exists between the gate and the source of each of the FETs 302 and 304. For this reason, a capacitor 400 is connected between the gate EGA and the source ES and a capacitor 402 between the gate EGB and the source ES. Because a capacity and a resistance exist in parallel between the gate and the drain of each FET 302 or 304, a parallel connection of a capacitor 404 and a resistor 406 is connected between the gate EGA and the drain EDA and a parallel connection of a capacitor 408 and a resistor 410 between the gate EGB and the drain EDB. Likewise, a capacity and a resistance intervene between the drain and source of each FET 302 or 304 and this is accommodated by a parallel connection of a capacitor 412 and a resistor 414 between the drain EDA and the source ES and a parallel connection of a capacitor 416 and a resistor 418 between the drain EDB and the source ES. A current source 420 is connected between the drain EDA and the source ES while a current source 422 is connected between the drain EDB and the source ES. Supposing that the mutual conductance of the FETs 302 and 304 is Gm, the magnitude of the current supplied by the current source 420 is GmVA and that of the current supplied by the other current source 422 is GmVB. The direction of each current depends upon the polarity of the input signal VA or VB.

As shown in FIG. 3, the resistors 310 and 312 are respectively connected to the drains EDA and EDB of the FETs 302 and 304. These resistors 310 and 312 are connected to the terminal QA and further to a bias power source (not shown) and, therefore, to ground in an equivalent circuit. Thus, a resistor 310 is connected between the drain EDA and ground and a resistor 312 between the drain EDB and ground as shown in FIG. 4.

The capacitors 326 and 328 shown in FIG. 3 are omitted in FIG. 4 because their impedance is low against a signal. Therefore, the drain EDB of the FET 304 is connected to the resistor 336 and the resistor to the ground.

The operational amplifier constituted by the dual FET 320 and the operational amplifier 340 are considered to function as a single operational amplifier. The equivalent circuit is represented by a Nullator 424 and a Norator 426. The Nullator 424 is connected between the drains EDA and EDB of the FETs 302 and 304 while the Norator 426 is connected between the output terminal TC and ground. Although an ordinary operational amplifier has nothing connected between a Nullator and a Norator in its equivalent circuit, the feedback resistor 342 is connected therebetween in accordance with the illustrated embodiment.

In the equivalent circuit shown and described, the output signal VC may be expressed as:

$$VC = Zf \cdot Gm(VA - VB) + Rl \cdot Gm \cdot VA \qquad \text{Eq. (7)}$$

where Rl is the resistance of the resistors 310 and 312 and Zf, the resistance of the resistor 342.

Supposing $Zf >> R$, then:

$$VC \approx Zf \cdot Gm(VA - VB) \qquad \text{Eq. (8)}$$

Therefore, the amplification degree $Av_1$ of the amplifier circuit shown in FIG. 3 is produced by:

$$Av_1 = \frac{VC}{VA - VB} = Gm \cdot Zf \qquad \text{Eq. (9)}$$

It follows that the amplification degree of the amplifier circuit has dependency upon the mutual conductance Gm of the dual FET 300, which is the initial stage defferential amplifier, and the resistance of the feedback resistor 342.

Figure 5:
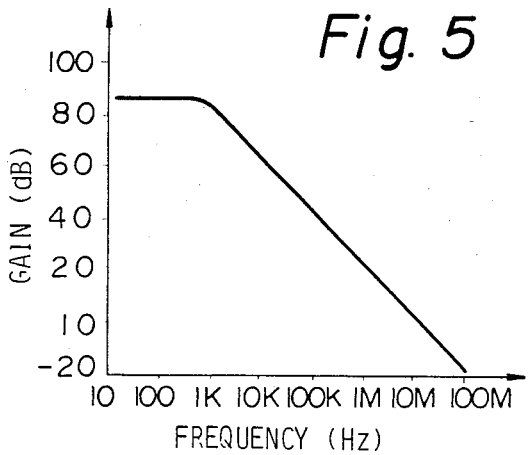
FIG. 5 is a plot showing an exemplary closed loop frequency characteristic of an operational amplifier used for the amplifier circuit of the present invention.

The operational amplifier 340 of the circuit shown in FIG. 3 may comprise the operational amplifier shown in FIG. 5 which has the closed loop frequency characteristic, GB product of substantially 20 MHz, and noise voltage of 15 nV/√Hz. The dual FETs 300 and 320 may comprise those having a noise voltage of 1 nV/√Hz.

Where the amplification degree $Av_1$ of the Eq. (9) is 80 dB, for example, under the condition described above, the gain to frequency characteristic of the amplifier circuit shown in FIG. 3 will follow the curve plotted in FIG. 6. As shown, the curve remains flat up to the frequency of 2 MHz and the GB product is 20 GHz. Measurement showed that the noise voltage is substantially determined by the first stage dual FET 300 and approximately 0.6 nV/√Hz. Such a noise voltage is far smaller than the noise voltage (3–4 nV/√Hz) of the prior art circuit shown in FIG. 1, thus proving a desirable cut-down in noise.

Figure 7:
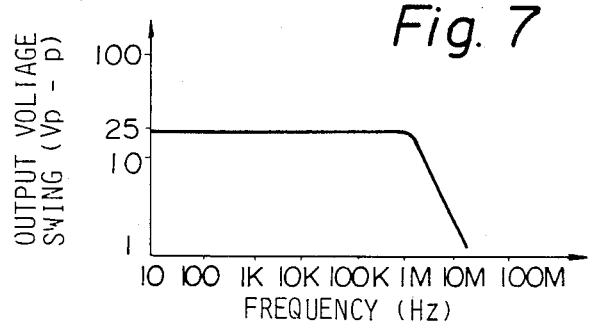
FIG. 7 is a plot showing an exemplary output voltage to frequency characteristic of the amplifier circuit of the present invention with respect to a power source voltage swing.

Referring to FIG. 7, the curve represents an output voltage swing to frequency characteristic of the amplifier circuit shown in FIG. 3 which was obtained by applying bias voltages of +15 V and −15 V to terminals QA and QB respectively. It will be seen from the curve that an output voltage substantially identical with the source voltage is attained over the frequency range of 0 Hz to substantially 2 MHz. Actual measurement proved that the output signal VC at the output terminal TC is substantially free from distortion.

Figure 6:
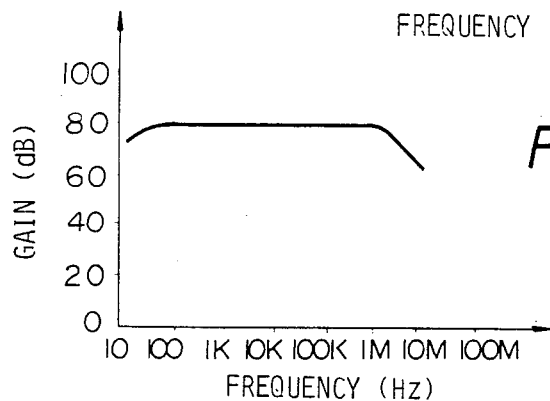
FIG. 6 is a plot showing an exemplary gain to frequency characteristic attainable with the amplifier circuit of the present invention.

In the gain to frequency characteristic shown in FIG. 6, the gain becomes samller in the low frequency side and this owes to the coupling capacitors 326 and 328. The degree of such a gain drop has dependency upon the time constant determined by the capacitor 326 and resistor 310 or the time constant determined by the capacitor 328 and resistor 312. If desired, the capacitors 326 and 328 may be omitted to directly connect the drains of the dual FET to the gates of the dual FET 320.

Figure 8:
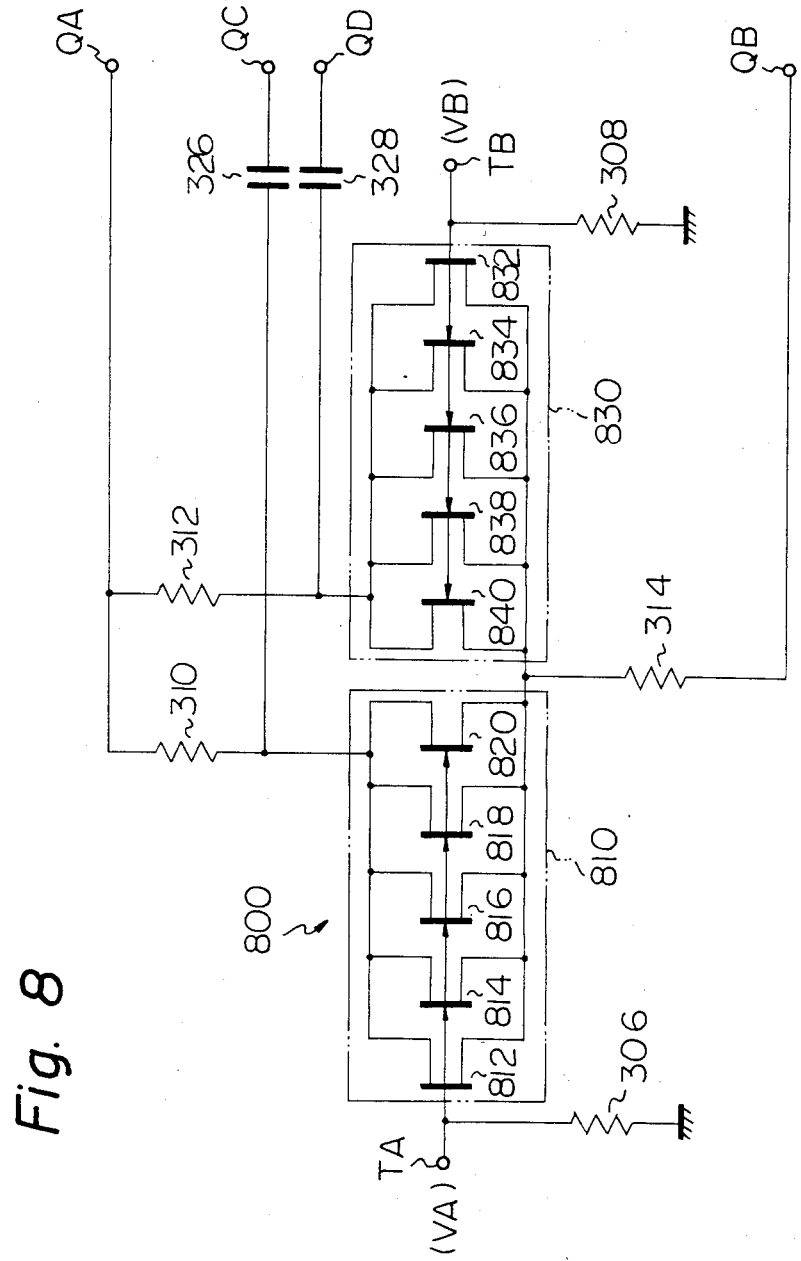
FIG. 8 is a circuit diagram showing another embodiment of the present invention.

Referring to FIG. 8, another embodiment of the present invention is illustrated. As previously mentioned, it was confirmed by measurement that the noise voltage of the amplifier circuit shown in FIG. 3 is substantially dependent upon the noise voltage in the first stage differential amplifier. This implies that decreasing the noise voltage in the first stage differential amplifier is effective to reduce the noise voltage of the whole circuitry. The construction shown in FIG. 8 embodies such conception. In FIG. 8, the same structural elements as those of the first embodiment are designated by the like reference numerals and will not be described any further for simplicity.

In FIG. 8, a dual FET 800 comprises a first group of FETs 810 and a second group of FETs 830 which in combination serve as the first stage differential amplifier. The FET group 810 comprises a parallel connection of FETs 812, 814, 816, 818 and 820 and the FET group 830, a parallel connection of FETs 832, 834, 836, 838 and 840. The construction shown in FIG. 8 is substantially identical with the construction of FIG. 3 except for the arrangement of the first stage dual FET. Terminals QC and QD are respectively connected to the gates of the dual FET 320 shown in FIG. 3.

As generally known in the art, the amplifier circuit shown in FIG. 8 will reduce the noise voltage thereof to $1/\sqrt{5}$. The amplification degree $Av_2$ is obtained from the Eq. (9) as follows:

$$Av_2 = Gm_2 \cdot Zf \qquad \text{Eq. (10)}$$

Generally, the noise voltage will decrease to $1/\sqrt{n}$ if each of the FET groups 810 and 830 is made up of "n" FETs.

In summary, it will be seen that the present invention desirably reduces the noise voltage, increases the GB product, and cuts down the distortion of a signal, with a simple and economical circuitry which is suitable for integration.

Various modifications will become possible for those skilled in the art after receiving the teachings of the present disclosure without departing from the scope thereof. For example, the active elements constituting the differential amplifiers may comprise such bipolar elements as junction type transistors, instead of the unipolar elements shown and described. While resistors, capacitors and power sources may constitute a source of noise in addition to the active elements, the noise due to such elements is very low level and, in practice, negligible.

What is claimed is:

1. An amplifier circuit comprising:
   a differential amplifier having a pair of first and second transistors, the gates of which are connected to first and second input terminals respectively, each of the first and second input terminals being supplied with an input signal;
   an operational amplifier having inverting and non-inverting input terminals which are connected to the drains of the first and second transistors respectively; and
   a feedback resistor for negatively feeding back an output signal of said operational amplifier to the gate of the second transistor of the differential amplifier such that the output signal of said operational amplifier is inverted by the second transistor and the inverted signal is fed to the non-inverting input terminal of said operational amplifier.

2. An amplifier circuit as claimed in claim 1, in which an active element constituting the differential amplifier has a high input impedance.

3. An amplifier circuit as claimed in claim 1, in which an active element constituting the differential amplifier comprises an active element group which is made up of a plurality of parallel active elements.

4. An amplifier circuit as claimed in claim 2, in which an active element constituting the differential amplifier comprises an active element group which is made up of a plurality of parallel active elements.

5. An amplifier circuit comprising:
   a first differential amplifier having a pair of first and second transistors, the gates of which are connected to first and second input terminals respectively, each of the first and second input terminals being supplied with an input signal;
   a second differential amplifier having a pair of third and fourth transistors, the gates of which are connected to the drains of the second and first transistors respectively;
   an operational amplifier having inverting and non-inverting input terminals which are connected to the drains of the third and fourth transistors respectively; and
   a feedback resistor for negatively feeding back an output signal of said operational amplifier to the gate of the fourth transistor of the second differential amplifier such that the output signal of said operational amplifier is inverted by the fourth transistor and the inverted signal is fed to the non-inverting input terminal of said operational amplifier.

6. An amplifier circuit as claimed in claim 5, in which an active element constituting each of the first and second differential amplifiers has a high input impedance.

7. An amplifier circuit as claimed in claim 5, in which an active element constituting the first differential amplifier comprises an active element group which is made up of a plurality of parallel active elements.

8. An amplifier circuit as claimed in claim 6, in which the active element constituting the first differential amplifier comprises an active element group which is made up of a plurality of parallel active elements.

* * * * *